(12) United States Patent
Caruyer et al.

(10) Patent No.: US 7,960,900 B2
(45) Date of Patent: Jun. 14, 2011

(54) ASSEMBLY OF A MICROSWITCH AND OF AN ACOUSTIC RESONATOR

(75) Inventors: Grégory Caruyer, Goncelin (FR); Guillaume Bouche, Grenoble (FR); Pascal Ancey, Revel (FR)

(73) Assignee: STMicroelectronics S.A., Montrouge (FR)

( * ) Notice: Subject to any disclaimer, the term of this patent is extended or adjusted under 35 U.S.C. 154(b) by 601 days.

(21) Appl. No.: 11/629,586

(22) PCT Filed: Jun. 13, 2005

(86) PCT No.: PCT/FR2005/050439
§ 371 (c)(1),
(2), (4) Date: Jan. 28, 2008

(87) PCT Pub. No.: WO2006/000731
PCT Pub. Date: Jan. 5, 2006

(65) Prior Publication Data
US 2008/0283373 A1   Nov. 20, 2008

(30) Foreign Application Priority Data
Jun. 14, 2004   (FR) ..................................... 04 51171

(51) Int. Cl.
*H01L 41/08* (2006.01)
(52) U.S. Cl. ..................... 310/330; 310/331; 200/181

(58) Field of Classification Search .......... 310/330–332; 200/181
See application file for complete search history.

(56) References Cited

U.S. PATENT DOCUMENTS

| | | | | |
|---|---|---|---|---|
| 4,585,970 A * | 4/1986 | Koal et al. | | 310/331 |
| 4,906,840 A * | 3/1990 | Zdeblick et al. | | 850/1 |
| RE33,691 E * | 9/1991 | Harnden et al. | | 310/332 |
| 6,204,737 B1* | 3/2001 | Ella | | 333/187 |
| 6,379,510 B1* | 4/2002 | Kane et al. | | 204/192.34 |
| 7,126,254 B2* | 10/2006 | Nanataki et al. | | 310/324 |
| 7,215,064 B2* | 5/2007 | Mehta | | 310/331 |
| 7,280,014 B2* | 10/2007 | Potter | | 335/78 |
| 7,420,320 B2* | 9/2008 | Sano et al. | | 310/363 |
| 7,466,060 B2* | 12/2008 | Ikehashi | | 310/309 |
| 7,567,018 B2* | 7/2009 | Kawakubo et al. | | 310/328 |
| 7,586,238 B2* | 9/2009 | Liu | | 310/328 |
| 2004/0075366 A1* | 4/2004 | Mehta | | 310/336 |
| 2004/0183402 A1* | 9/2004 | Mizuyama et al. | | 310/328 |
| 2005/0162040 A1 | 7/2005 | Robert | | |
| 2009/0211884 A1* | 8/2009 | Pelzer et al. | | 200/181 |

OTHER PUBLICATIONS

International Search Report from corresponding International Application PCT/FR2005/050439 filed Jun. 13, 2005.

* cited by examiner

*Primary Examiner* — J. SanMartin
(74) *Attorney, Agent, or Firm* — Lisa K. Jorgenson; James H. Morris; Wolf, Greenfield & Sacks, P.C.

(57) ABSTRACT

The invention relates to a device consisting of an electromechanical microswitch comprising mobile beam (2). According to the invention, at least part (14) of the beam forms the piezoelectric element of a piezoelectric actuator.

21 Claims, 3 Drawing Sheets

ASSEMBLY OF A MICROSWITCH AND OF AN ACOUSTIC RESONATOR

BACKGROUND OF THE INVENTION

1. Field of the Invention

The present invention relates to the field of electromechanical circuits or microsystems (MEMS). These circuits are especially used in mobile phone radio frequency applications.

2. Discussion of the Related Art

WO01/13457 discloses a switch having a beam embedded at an extremity, including a piezoelectric actuation means formed of a unit disposed on a portion of the mobile beam. This unit is made of a plurality of layers parallel to the surface of the beam. The first layer is a conductive electrode, the second layer is a piezoelectric layer (PZT), the third layer is a second conductive electrode. When an electric voltage is applied between the first and second electrodes, the unit expands in the direction of the length of the beam. Therefore, a bi-metal effect appears between the beam and the piezoelectric unit that causes a bending of the beam. This structure is difficult to manufacture and necessitates a large number of steps for depositing the different layers one above the others.

Additionally, EP Patent Application 0963000 discloses an electrostatically actuated mechanic microswitch and a resonator assembled in the same device. The actuation mode is not suitable for a large number of applications and the use of a piezoelectric actuator of the above type in such a device may result in a complex structure.

SUMMARY OF THE INVENTION

An object of the present invention is to provide a mechanical microswitch with a piezoelectric actuation of simple structure.

Another object of the present invention is to provide such a mechanical microswitch with a piezoelectric actuation capable of being simply assembled with an acoustic resonator in integrated form.

Another object of the present invention is to provide a mode for manufacturing the device in integrated form, by using a conventional integrated circuit manufacturing technology.

To achieve these and other objects, the present invention provides an electromechanical microswitch comprising a mobile beam above a substrate and an actuator formed in a piezoelectric material capable of bending the beam, wherein the actuator forms an area of the beam and a portion of the actuator is integral with the substrate through one of its surfaces.

According to an embodiment of the present invention, at least a pair of electrodes is arranged on opposite sides of the piezoelectric material.

According to an embodiment of the present invention, at least a portion of said beam forms the piezoelectric element of a bulk acoustic wave resonator.

According to an embodiment of the present invention, at least one pair of electrodes is arranged on either side of said portion of the beam.

According to an embodiment of the present invention, said portion of said beam is formed of the same piezoelectric material as said actuator.

According to an embodiment of the present invention, only one portion of the piezoelectric material, surrounded by a pair of electrodes, has the functions of an actuator and a resonator.

According to an embodiment of the present invention, the material forming the mobile beam belongs to the group comprising AlN, ZnO, and a PZT ceramic ($Pb_xZr_yTi_zO_t$ with $0.8 < x < 1.2$; $0.8 < y < 1.2$; $0.8 < z < 1.2$; $2 < t < 4$).

According to an embodiment of the present invention, the mobile beam is made of AlN.

The present invention also provides a method for manufacturing a device comprising a mechanical microswitch comprising a mobile beam comprising an acoustic resonator, comprising the steps of:

a) depositing a conductive contact in a recess located in a substrate;

b) filling the recess with a sacrificial material;

c) forming metal electrodes on the sacrificial material;

d) depositing a piezoelectric material intended to form the mobile beam;

e) depositing metal electrodes on the beam; and f) etching, according to a pattern, the piezoelectric material and removing said sacrificial material.

BRIEF DESCRIPTION OF THE DRAWINGS

The foregoing and other objects, features, and advantages of the present invention will be discussed in detail in the following non-limiting description of specific embodiments in connection with the accompanying drawings, in which.

DETAILED DESCRIPTION

Figure 1A:
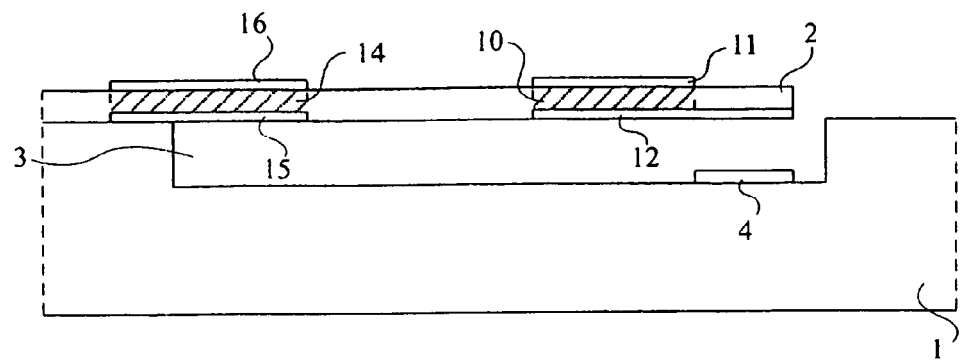
FIGS. 1A and 1B show an embodiment of a device according to the present invention in first and second switching positions.

For clarity, the same elements have been designated with the same reference numerals in the different drawings. Further, as usual in the representation of integrated circuits and of electromechanical microcircuits, the various drawings are not to scale.

Figure 1B:
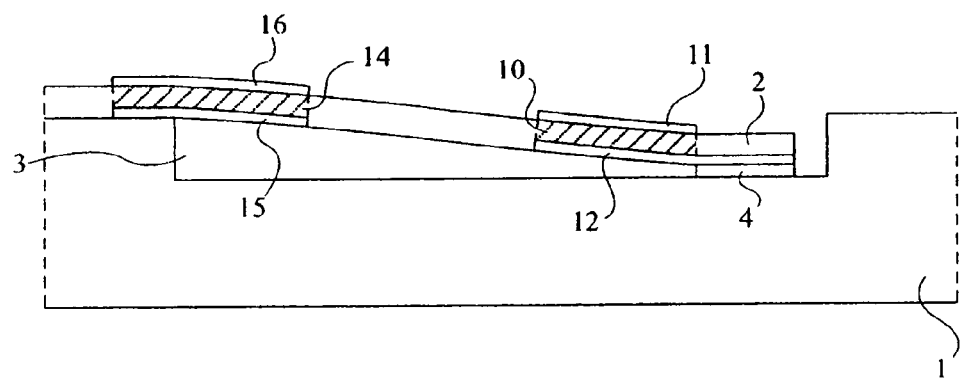

FIGS. 1A and 1B show in partial and simplified manner an example of embodiment of a device according to the present invention integrating a mechanical microswitch and a bulk acoustic wave filter. In FIG. 1A, the switch is shown in the off state. In FIG. 1B, the switch is shown in the on state.

The device comprises an insulating substrate 1, for example, made of glass, of alumina ($Al_2O_3$), or of aluminum nitride (AlN). The substrate may also be made of a conductor or semiconductor material, coated with an insulating layer where an insulation is required. A mobile beam 2 rests on substrate 1 and extends above a recess 3. At the bottom of recess 3 is a conductive contact 4. On the lower surface of mobile beam 2 is a conductive contact 12. Mobile beam 2 and contacts 4 and 12 altogether form an electromechanical microswitch.

The present invention provides that the beam is actuated by a piezoelectric type actuator. This actuator forms, locally, the beam body. Reference 14 designates a piezoelectric area arranged between electrodes 15 and 16. A portion of the lower surface of this piezoelectric area is integral with the substrate 1 through the electrode 15. Therefore, in case of longitudinal stress of the piezoelectric material 14, this one is also deformed transversally to absorb a portion of the stresses generated in the portion integral with the substrate. When a d.c. voltage is applied between the electrodes 15 and 16, this causes for example an extension of the area 14 and therefore a flexion of the beam and one passes from the state shown in FIG. 1A to the state shown in FIG. 1B.

The present invention further provides integrating in such a switch a bulk acoustic wave resonator. For this purpose, beam 2 or at least a portion 10 of this beam is made of a material capable of forming, once placed between two electrodes, the bulk of a bulk acoustic wave resonator. As illustrated in FIGS. 1A and 1B, portion 10 is arranged between upper 11 and lower 12 electrodes. Conventionally, material 10 is made of a piezoelectric material. In the following description and in the claims, it should be generally understood that what is called a piezoelectric material encompasses any material capable of forming the bulk of a bulk acoustic wave resonator, for example, a material exhibiting a piezoelectric and electrostrictive character.

Conventionally, to form a bulk acoustic wave resonator capable of operating at frequencies on the order of one gigahertz, dimensions in top view on the order of some hundred micrometers may be provided, which is compatible with the usual dimensions of an electromechanical microswitch, such switches currently having a beam length on the order of a few hundreds of micrometers and a thickness on the order of a few micrometers.

In FIGS. 1A and 1B, area 10 forming the resonator is arranged between electrodes 11 and 12, electrode 12 being common with the contact region of the microswitch arranged on beam 2. This corresponds to an association of a resonator and of a switch in which a terminal of the resonator is connected to a terminal of the switch.

In FIGS. 1A and 1B, only the useful portions of the contact electrodes, of the resonator, and of deformation of the mobile beam, have been shown. The electrodes will be connected to external terminals by conductive tracks (not shown) formed on the beam. Similarly, a connection will be established with conductive contact pad 4. According to the used technologies, tracks running from electrodes 11 and 12 to the upper terminals of the substrate will pass by electrodes 16 and 15 which will not take up the entire beam width or will be provided at a lower or high metallization level. Further, as usual, contacts will be taken with the tracks of connection by vias.

Figure 2:
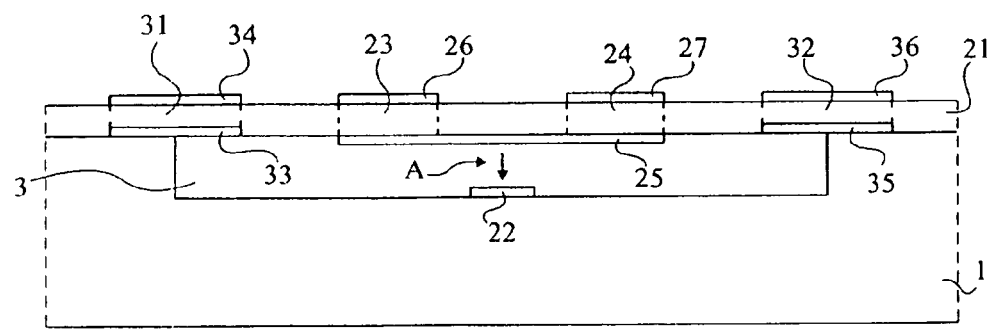
FIG. 2 shows another embodiment of a device according to the present invention.

FIG. 2 shows an alternative of the present invention in which two resonators are arranged on a same mobile beam 21 fixed at its two ends, the junction point of these resonators being connected to a terminal of a microswitch. In the case of FIG. 2, a beam 21 rests at its two ends on a substrate 1 and extends above a recess 3 of this substrate. A contact pad 22 is arranged substantially in the middle of recess 3. The beam comprises two resonator portions 23 and 24. A lower electrode 25 extends under the first resonator portion. The central portion of electrode 25 forms the upper contact pad of the microswitch. Upper electrodes 26 and 27 are arranged above each of the resonator regions. To deform beam 21 and turn on the switch, two piezoelectric material regions 31 and 32 surrounded with respective electrodes 33-34 and 35-36 are provided. When a voltage is applied between electrodes 33-34 and 35-36, beam 21 is made to deform so that a contact establishes between the central portion of metallization 25 and contact pad 22 of the switch.

The structure of FIG. 2 can have many variations, for example, the presence of two regions 31 and 32 of action on the switch is not strictly necessary, a single one of these regions can be provided. On the other hand, as indicated previously, other microswitch actuation modes may be provided.

The two resonators may have identical or different features. To obtain different features, it may, for example, be provided for these microresonators to have electrode shapes or different dimensions. The central frequency of one of the resonators may also be modified by covering it with an additional layer, for example, $SiO_2$ or SiN. Further, in the case of FIG. 1 as well as in the case of FIG. 2, the number of resonators formed on the beam may further be increased if the dimensions of the resonator and of the beam are compatible with current dimensions of the forming of such devices.

Further, in FIG. 2, as in FIGS. 1A and 1B, the connections with the various electrodes have not been shown. As indicated previously, these connections may be formed by those skilled in the art in any conventional manner.

According to an alternative embodiment, the invention provides a device comprising a single piezoelectric area cumulating the functions of actuator and resonator. Only one electrode pair addresses this device. An electric signal comprising a d.c. component and an a.c. component is applied to the electrode pair. The deformation of the beam is caused by the d.c. component of the signal, the device being capable of entering a resonance under the effect of the effect of the a.c. component of the same signal. In an example of this arrangement, the free length of the beam 2 above the recess 3 is about 300 µm. The width of the beam is about 50 µm. The actuator-resonator device forms the body of the beam on a length of 210 µm and lies integrally with the substrate 1 on a length of 10 µm. Therefore, the largest portion (200 µm) of this actuator-resonator device is arranged above the recess 3.

A structure according to the present invention may be formed by methods conventional in the field of the forming of integrated circuits and of electromechanical microcomponents.

FIGS. 3A to 3F illustrate an example of embodiment of the structure of FIGS. 1A and 1B. Many other alternative embodiments may be devised by those skilled in the art. The same elements, even at intermediary manufacturing steps, will be designated with the reference numerals that they bear in FIG. 2.

Figure 3A:
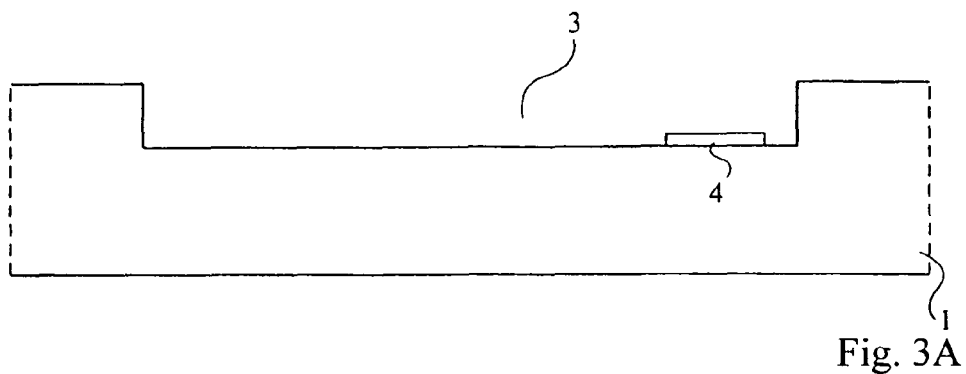
FIGS. 3A to 3F illustrate, as an example, successive steps of the manufacturing of a device according to the present invention.

At an initial step illustrated in FIG. 3A, a recess 3 and a conductive contact 4 at the bottom of this recess are formed in a substrate 1.

Figure 3B:
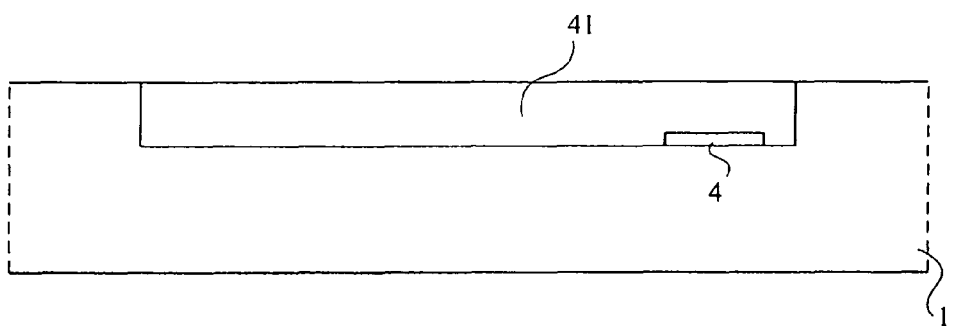

At the step illustrated in FIG. 3B, a sacrificial layer 41, for example, made of resin, fills recess 3.

Figure 3C:
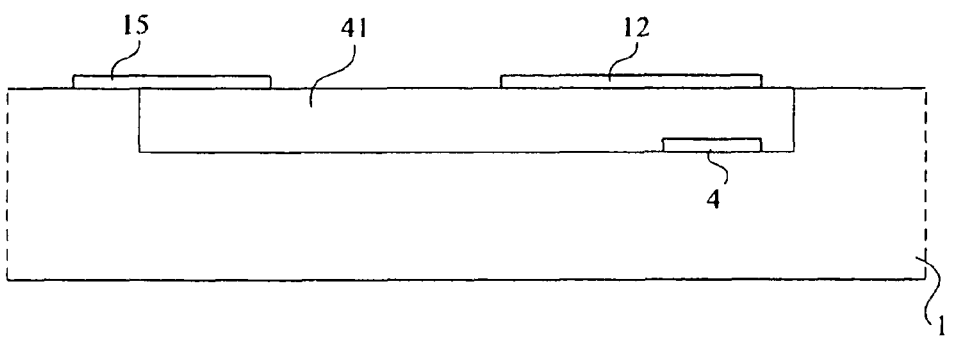

At the step illustrated in FIG. 3C, a metallization layer is formed and etched to form electrodes 12 and 15.

Figure 3D:
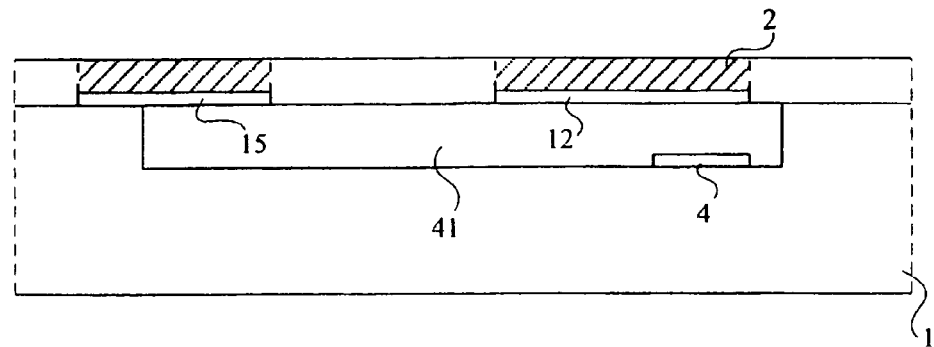

At the step illustrated in FIG. 3D, the material intended to form beam 2, the active portion 10 of the resonator, and actuation area 14 is grown. This material for example is aluminum nitride (AlN). In a known fashion, if the metal of electrodes 12 and 15 is properly selected, for example, tungsten or molybdenum, a crystalline growth of AlN is obtained, whereby AlN forms a good piezoelectric material above the metallizations, in the hatched areas of FIG. 3D. The deposition of AlN is, for example, formed by a physical deposition by sputtering of an aluminum target in a nitrogenous reactive medium. Above the resin, the AlN layer may exhibit mediocre piezoelectric properties but, in these regions, such features are not useful.

Figure 3E:
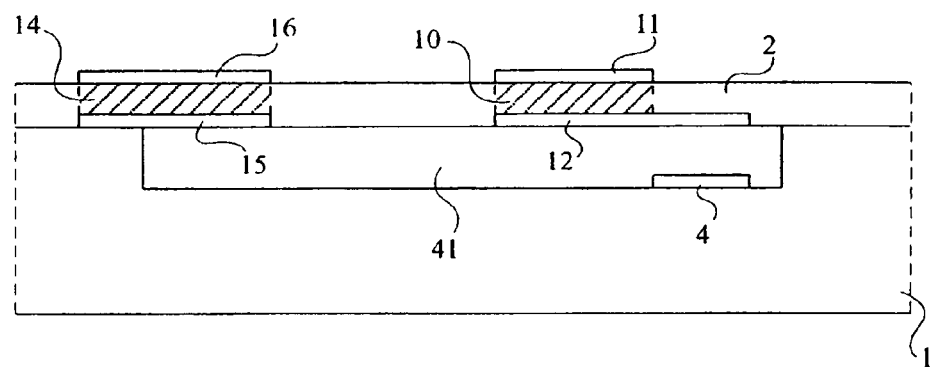

At the step illustrated in FIG. 3E, an upper metallization layer which is etched to form electrodes 11 and 16 is formed. Possibly at the end of this same etch step are the connections intended to establish contacts with electrodes 11 and 16 defined. Similarly, upon forming of region 4 on the substrate and of region 12 and 15, interconnections may be formed in the same step.

Figure 3F:
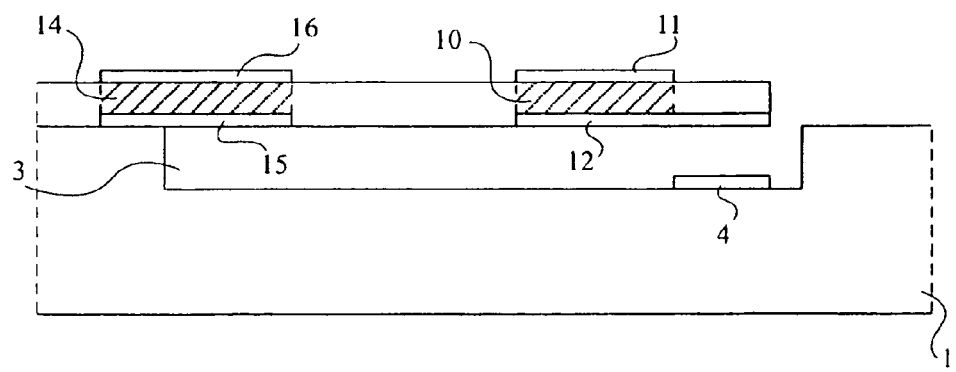

At the step illustrated in FIG. 3F, the AlN is etched to define the beam shape and reach the underlying resin, after which sacrificial layer 41 is removed and the structure illustrated in FIG. 1A is obtained.

Of course, the present invention is likely to have various alterations, modifications, and improvements which will readily occur to those skilled in the art. In particular, the metal electrodes are made of a material conventionally used to form electromechanical microswitches. As an example, aluminum, tungsten, platinum, gold, and molybdenum can be mentioned. Bilayers may also be used, the lower layer, for example, made of gold, being used as a contact electrode, while the upper layer, for example, made of Mo, aims at properly crystallographically orienting the layer. The material forming the mobile beam will be preferentially selected from the group comprising AlN, ZnO, and a PZT ceramic ($Pb_xZr_yTi_zO_t$ with $0.8<x<1.2$; $0.8<y<1.2$; $0.8<z<1.2$; $2<t<4$). For the sacrificial material (41), instead of resin, any material being easily removable by a selective etch, for example, a silicon-germanium alloy or a silicon oxide, may be used. Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. An electromechanical microswitch comprising:
   a flexible beam coupled to a substrate; and
   an actuator comprising piezoelectric material adapted to bend the beam to enable electrical switching, wherein the actuator forms a first portion of the beam and a portion of the actuator is integral with the substrate through one of its surfaces, wherein at least a second portion of said beam comprises a piezoelectric bulk acoustic wave resonator, said second portion of said beam being formed of the same piezoelectric material as said actuator, and wherein the first or second portion of the beam includes a pair of electrodes arranged on either side respectively of first or second portions, and is adapted to function as an actuator and a resonator.

2. The microswitch of claim 1, wherein a first pair of electrodes is arranged on opposite sides of the piezoelectric material.

3. The microswitch of claim 2, wherein at least a second pair of electrodes is arranged on either side of said second portion of the beam.

4. The microswitch of claim 3, wherein the flexible beam is made of AlN.

5. The microswitch of claim 1, wherein the material forming the flexible beam comprises a material selected from the following group: AlN, ZnO, and a PZT ceramic.

6. The microswitch of claim 1 incorporated in a mobile phone or mobile communication device.

7. A combined microelectromechanical switch and bulk acoustic wave resonator comprising:
   a flexible beam coupled to a substrate;
   an actuating portion of the flexible beam comprising a first piezoelectric material configured to bend the flexible beam to enable electrical switching; and
   a resonating portion of the flexible beam comprising a second piezoelectric material configured to resonate as the bulk acoustic wave resonator.

8. The apparatus of claim 7, wherein the actuating portion is separated from the resonating portion.

9. The apparatus of claim 7, wherein the first piezoelectric material and second piezoelectric material are portions of a same material.

10. The apparatus of claim 7, wherein the actuating portion is integral with the substrate.

11. The apparatus of claim 7, further comprising:
    a first pair of electrodes disposed on opposite sides of the actuating portion; and
    a second pair of electrodes disposed on opposite sides of the resonating portion.

12. The apparatus of claim 11, further comprising a contact electrode disposed such that one of the second pair of electrodes contacts the contact electrode to establish the electrical switching.

13. The apparatus of claim 7, wherein the material forming the flexible beam comprises a material selected from the following group: AlN, ZnO, and a PZT ceramic.

14. The apparatus of claim 7 incorporated in a mobile phone or mobile communication device.

15. A combined microelectromechanical switch comprising:
    a flexible beam coupled to a substrate;
    at a first portion of the beam, means for bending the flexible beam to enable electrical switching; and
    at a second portion of the beam, means for establishing bulk acoustic wave resonance within the second portion.

16. The apparatus of claim 15, wherein the first portion is separate from the second portion.

17. The apparatus of claim 15, wherein the first portion is integral with the substrate.

18. The apparatus of claim 15, wherein the second portion includes a pair of electrodes, and one of the pair of electrodes contacts a contact electrode to establish the electrical switching.

19. The apparatus of claim 15, wherein the first portion and second portion comprise piezoelectric material.

20. The apparatus of claim 15, wherein the first portion and second portion comprise a material selected from the following group: AlN, ZnO, and a PZT ceramic.

21. The apparatus of claim 15 incorporated in a mobile phone or mobile communication device.

* * * * *